United States Patent [19]
Lee

[11] Patent Number: 5,872,057
[45] Date of Patent: Feb. 16, 1999

[54] METHOD OF FORMING OXIDE DIELECTRIC LAYER ON REFRACTORY METAL SILICIDE GATE

[75] Inventor: Sian F. Lee, Hsin-Chu, Taiwan

[73] Assignee: Taiwan Semiconductor Manufacturing Co., Ltd., Hsin-Chu, Taiwan

[21] Appl. No.: 753,319

[22] Filed: Nov. 22, 1996

[51] Int. Cl.⁶ .................................................. H01L 21/44
[52] U.S. Cl. ......................... 438/655; 438/656; 438/657
[58] Field of Search .................................. 438/592, 636, 438/655, 656, 657, 660, 664, 353, 360

[56] References Cited

U.S. PATENT DOCUMENTS

| | | | |
|---|---|---|---|
| 4,935,380 | 6/1990 | Okumura et al. | 437/200 |
| 4,974,056 | 11/1990 | Brodsky et al. | 357/71 |
| 5,428,244 | 6/1995 | Segawa et al. | 257/646 |
| 5,441,914 | 8/1995 | Taft et al. | 437/200 |
| 5,472,896 | 12/1995 | Chen et al. | 437/200 |
| 5,604,157 | 2/1997 | Dai et al. | 437/200 |

*Primary Examiner*—John F. Niebling
*Assistant Examiner*—Ha Tran Nguyen
*Attorney, Agent, or Firm*—Tung & Associates

[57] ABSTRACT

The present invention provides a method of forming an oxide dielectric layer on a tungsten silicide gate structure in a furnace oxidation process by first depositing a thin layer of amorphous silicon on top of the refractory metal silicide gate structure such that the refractory metal silicide is not damaged by the oxidant during the furnace oxidation process. For a tungsten silicide gate structure, a thin layer of amorphous silicon between about 10 Å and about 100 Å thick can be suitably used for such purpose.

14 Claims, 1 Drawing Sheet

METHOD OF FORMING OXIDE DIELECTRIC LAYER ON REFRACTORY METAL SILICIDE GATE

FIELD OF THE INVENTION

The present invention generally relates to a method of forming an oxide dielectric layer on a refractory metal silicide gate structure by an oxidation process and more particularly, relates to a method of forming an oxide dielectric layer on a refractory metal silicide gate structure by an oxidation process wherein a thin layer of amorphous silicon is first deposited on top of the refractory metal silicide gate as a diffusion barrier for the oxidant utilized in the oxidation process in order to prevent surface oxidation of the refractory metal silicide.

BACKGROUND OF THE INVENTION

Refractory metal silicides have been used in microelectronic applications by reacting refractory metals with silicon. The more popularly used refractory metal silicides include tungsten silicide ($WSi_2$), titanium silicide ($TiSi_2$), cobalt silicide ($CoSi_2$), molybdenum silcide ($MoSi_2$) and tantalum silicide ($TaSi_2$). Based on their low resistivities and stability when in contact with polysilicon gates and junctions, $WSi_2$, $TiSi_2$ and $CoSi_2$ are most commonly used silicides. To form a silicide selectively over exposed silicon regions, a refractory metal such as W or Ti can be first deposited over the entire wafer by a technique of sputtering, evaporation, or chemical vapor deposition (CVD). The deposition process is then followed by a two-step furnace or rapid-thermal annealing. For titanium, for example, the first annealing step consists of annealing at a temperature of 650° C. for about 20 minutes in a nitrogen atmosphere while nitrogen reacts with titanium to form titanium nitride at the surface of the metal. Simultaneously, titanium reacts with silicon and forms silicide in the regions where titanium is in contact with silicon.

$WSi_2$ is used widely on top of gate polysilicon to form a low-resistance polycide gate. The word polycide is used to indicate the combination of a layer of refractory metal silicide deposited on a layer of polysilicon. $WSi_2$ are usually deposited by a sputtering technique or a CVD technique for use in ULSI devices. For the CVD method, $WSi_2$ can be readily formed by using a silane reduction of tungsten fluoride ($WF_6$) at a relatively low temperature, i.e., between about 300° C. and 400° C. As in most CVD reactions, the flow rates of $WF_6$ and $SiH_4$ control the outcome of the reaction. A higher $SiH_4/WF_6$ ratio usually results in $WSi_2$ deposition. In practice, a high ratio of $SiH_4/WF_6$, i.e., greater than 10, is used to ensure the deposition of $WSi_2$. CVD $WSi_2$ is widely used on gate polysilicon and must survive high temperature exposures, i.e., 800° C. to 1000° C. during source/drain formation and reoxidation. $WSi_2$ films produced from a silane reduction process has relatively poor step coverage. In addition, the high fluorine and chlorine content in the film tend to cause diffusion problems with the gate oxide and band shifts.

To compensate for these problems, $WSi_2$ can be deposited by a reduction reaction of dichlorosilane ($SiH_2CL_2$, or DCS) at a higher reaction temperature, i.e., between about 500° C. and about 600° C. $WSi_2$ films deposited by the dichlorosilane reduction process contains less fluorine and chlorine than those from silane reduction process. While the resistivity and the film stress are comparable to those formed from silane reduction, $WSi_2$ deposited from DCS reduction has a better step coverage. As a result, many of the disadvantages of $WSi_2$ films formed by the silane process can be avoided and better deposition quality and process control can be achieved. The $WSi_2$ films produced from the DCS process therefore gradually replacing those produced from the silane process.

A typical $WSi_2$ polycide gate formation process is shown in FIGS. 1~3. In FIG. 1, a semiconductor device 10 is shown which consists of a silicon substrate 12, field oxide dielectric layers 14, and a gate oxide layer 16 deposited on top of the silicon substrate 12. In a typical $WSi_2$ CVD deposition process, as shown in FIG. 2, a polysilicon layer 22 is deposited on top of the gate oxide layer 16. The polysilicon layer 22 may be doped in-situ to further improve its conductivity. On top of the polysilicon layer 22, a refractory metal silicide layer 24 is then deposited by either a sputtering or a chemical vapor deposition technique. The most commonly used polycides are $WSi_2$, $TaSi_2$, and $MoSi_2$. These polycides are refractory, thermally stable, and resistant to most processing chemicals. In the next fabrication step, the polysilicon layer 22 and the refractory metal silicide layer 24 are patterned and formed into a gate structure 30. This is shown in FIG. 3.

After a polycide gate is formed, the gate structure must be isolated by depositing a dielectric layer on top. A most frequently used dielectric layer for such purpose is a silicon dioxide layer which can be deposited by a chemical vapor deposition process. While silane can be readily used to react with oxygen at relatively low reaction temperatures, i.e., below 500° C., to form silicon dioxide, the composition of the film formed is not stoichiometric and as a result, the film exhibits a low dielectric breakdown field and furthermore it has poor step coverage capability. A more desirable process for forming a stoichiometric oxide film can be performed by reacting dichlorosilane with nitrous oxide by using a large excess of $N_2O$ at lower pressures. However, the reaction temperature required for the dichlorosilane process is in the range between 700° C.~900° C., which is in excess of the melting temperatures of typical metals used for interconnections such as aluminum and copper.

In either the low temperature formation of silicon dioxide films by the silane process, or the high temperature formation of silicon dioxide films by the DCS process, a problem is frequently encountered on the surface of the refractory metal silicide gate. The problem is especially pronounced when the silicon dioxide layer is deposited on a tungsten silicide gate formed by DCS, i.e., the transformation of the surface layer of the tungsten silicide gate from a smooth, dense material to a fibrous, sponge-like material. The fibrous, sponge-like surface layer of $WSi_2$ is porous and therefore creates serious performance problems for the polycide gate. A fibrous, sponge-like surface layer of $WSi_2$ is illustrated in FIG. 4. It should be noted that the Figure is used for illustrative purpose only, and as such is not drawn to scale. The fibrous, sponge-like surface texture 34 appears after the deposition step for the silicon dioxide sidewall spacers 42.

The formation of the fibrous, sponge-like surface texture in $WSi_2$ has not been observed when the $WSi_2$ film is formed from a silane based reaction. Since the major difference between the $WSi_2$ film formed from a silane based reaction and that from a DCS based reaction is in the structure of the film, i.e., an amorphous structure is formed from the silane based reaction and a crystalline structure is formed from the DCS based reaction, the formation of the fibrous, sponge-like surface texture in $WSi_2$ is presumably caused by the crystalline structure of the film. When depositing the oxide layer by a $DCS/N_2O$ reaction at a higher reaction temperature, tungsten in $WSi_2$ reacts with oxygen and thus forms $WO_X$ at the surface of $WSi_2$. After the DCS gas enters the reaction chamber and reacts with $N_2O$, $SiO_2$ film is produced and deposited on top of the $WO_X$ layer and thus forming a fibrous, sponge-like appearance. It is hypothesized that during the oxide deposition process, $WSi_2$ must provide enough Si to react with the oxidants. In amorphous $WSi_2$ (formed by a silane base reaction), silicon can easily diffuse to the surface of $WSi_2$ and react with the oxidant in a manner much easier than silicon in a crystalline structure can. A $SiO_2$ film can thus be formed on the surface of $WSi_2$ to provide a uniform layer on the surface and furthermore, to act as a diffusion barrier for the oxidants.

It is therefore an object of the present invention to provide a method of forming an oxide dielectric layer on a refractory metal silicide gate that does not have the drawbacks and shortcomings of conventional oxidation methods.

It is another object of the present invention to provide a method of forming an oxide dielectric layer on a refractory metal silicide gate by providing a diffusion barrier on the gate to prevent any reaction with the oxidants.

It is a further object of the present invention to provide a method of forming an oxide dielectric layer on a refractory metal silicide gate by providing a diffusion barrier on the gate such that the refractory metal suicide does not react with the oxidants.

It is still another object of the present invention to provide a method of forming an oxide dielectric layer on a refractory metal silicide gate by depositing a thin layer of amorphous silicon on top of the gate prior to the oxidation process.

It is yet another object of the present invention to provide a method of forming oxide dielectric layer on a refractory metal silicide gate by first depositing a layer of amorphous silicon not less than 10 Å thickness on the refractory metal silicide gate before the oxidation process.

It is another further object of the present invention to provide a polycide gate structure formed of a refractory metal silicide and a polysilicon which is not affected by a subsequent oxide dielectric layer formation process.

SUMMARY OF THE INVENTION

The present invention provides a method of forming oxide dielectric layer on a refractory metal silicide gate by first depositing an amorphous silicon layer on top of the gate as a diffusion barrier layer such that the refractory metal silicide is protected during a subsequent oxidation process for depositing an oxide dielectric layer.

In a preferred embodiment, a method of forming an oxide dielectric layer on a refractory metal silicide gate structure is provided which includes the steps of first providing a semi-conducting substrate, forming a refractory metal silicide gate on the substrate, depositing an amorphous silicon layer on top of the gate structure, and depositing an oxide dielectric layer on top of the amorphous silicon and the gate. The refractory metal silicide can be selected from $WSi_2$, $TiSi_2$ and $TaSi_2$, The semi-conducting substrate is normally a silicon substrate. The thickness of the amorphous silicon layer deposited can be between about 10 Å and about 100 Å.

The present invention is further directed to a method of forming an oxide dielectric layer on a tungsten silicide gate structure including the steps of first providing a silicon substrate, then forming a tungsten silicide gate structure on the substrate, depositing an amorphous silicon layer of at least 10 Å thick on the tungsten silicide gate structure, and depositing an oxide layer on top of the amorphous silicon layer, whereby the amorphous silicon layer protects the tungsten silicide gate structure such that the formation of a porous, fibrous layer of a reaction product of tungsten silicide during the oxide formation process is prevented.

The present invention is also directed to a refractory metal silicide gate structure used in a semiconductor device including a silicon substrate, a gate oxide layer formed on the silicon substrate, a refractory metal silicide gate formed on the gate oxide layer, an amorphous silicon layer of at least 10 Å thick deposited on the gate, and an oxide dielectric layer formed over the amorphous silicon layer and the gate.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a method of forming an oxide dielectric layer on a refractory metal silicide gate structure by first depositing an amorphous silicon layer of at least 10 Å thick on the gate structure and then depositing an oxide dielectric layer on top such that the amorphous silicon layer acts as a diffusion barrier to protect to the refractory metal silicide from being damaged during the oxidation process. By depositing the additional thin amorphous silicon layer between the refractory metal silicide and the oxide dielectric layer, the potential formation of a porous, fibrous layer of an oxidation product of the refractory metal silicide which presents quality problems can be prevented.

In the development of 0.35 micron mix-mode (digital and analog) devices, when the device is processed in a CVD chamber for the deposition of oxide dielectric layer after a polycide gate etching, surface deformation in the refractory metal silicide material is frequently observed. The deformation of the surface layer of the refractory metal silicide appears as porous, fibrous and sponge-like which indicates that possibly a degassing process has occurred in the refractory metal silicide layer during the furnace oxidation process. This deformation in the refractory metal silicide material is more severe when a tungsten silicide is formed by a dichlorosilane process, instead of by a silane process. It is theorized that due to the crystalline structure of $WSi_2$ when formed by the dishlorosilane process, i.e., instead of the amorphous structure formed by the silane process, tungsten in $WSi_2$ reacts with oxygen to form a fibrous tungsten oxide layer on top of the silicide material since silicon can not escape to the surface to react with oxygen. This presents a severe problem when the dichlorosilane process is used for forming oxide since the reaction between dichlorosilane and nitrous oxide must be carried out at a temperature of approximately 800° C., i.e., significantly higher than that required in a silane process for forming oxide layers. The amorphous silicon layer also acts as a source of silicon for reacting with the oxidant (i.e., nitrous oxide) to form silicon dioxide such that oxidant does attack the refractory metal silicide layer under the amorphous silicon. The present invention therefore provides a novel method of first depositing a thin amorphous silicon layer as a diffusion barrier and as a sacrificial layer on the refractory metal silicide gate structure prior to the furnace oxidation process for forming the oxide dielectric layer.

Figure 1:
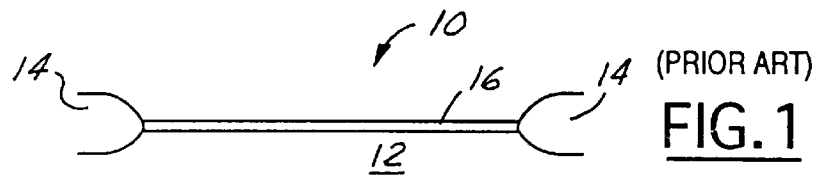
FIG. 1 is an enlarged, cross-sectional view of a conventional silicon substrate having a gate oxide layer deposited on top.
Figure 2:
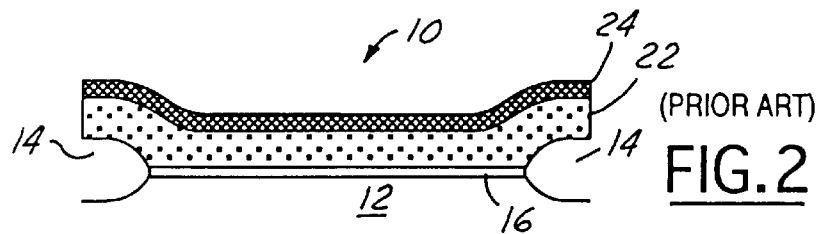
FIG. 2 is an enlarged, cross-sectional view of the silicon substrate shown in FIG. 1 having additional layers of polysilicon and refractory metal silicide deposited on top.
Figure 3:
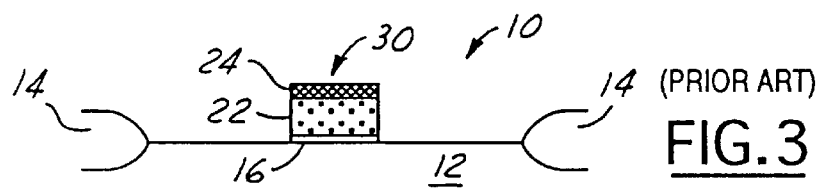
FIG. 3 is an enlarged, cross-sectional view of the semiconductor structure shown in FIG. 2 after a gate structure is patterned and formed.
Figure 4:
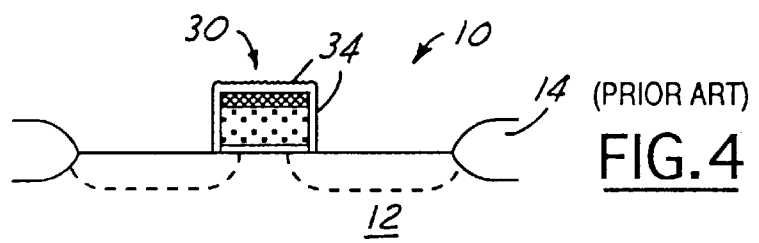
FIG. 4 is an enlarged, cross-sectional view of the semiconductor gate structure shown in FIG. 3 after an oxide dielectric layer is deposited on top of the gate structure.
Figure 5:
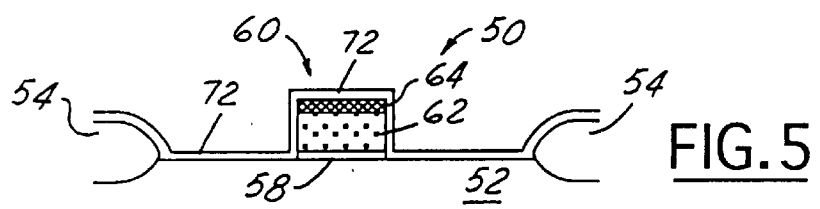
FIG. 5 is an enlarged, cross-sectional view of the present invention gate structure having a thin layer of amorphous silicon deposited on top.

Referring now to FIG. 5 wherein a present invention semiconductor structure 50 is shown. The semiconductor structure 50 includes a silicon substrate 52, field oxide dielectric layers 54, and a gate structure 60 built on the substrate 52. It is seen that the gate structure 60 is built by first depositing a gate oxide layer 58, a doped polysilicon layer 62, and a refractory metal silicide layer 64. The various layers are then patterned and etched to form the gate structure 60. On top of the gate structure 60, a thin amorphous silicon layer 72 is deposited to act as a diffusion barrier for the oxidant encountered in the next fabrication step. The amorphous silicon layer 72 can be deposited by a chemical vapor deposition technique and is normally deposited to a thickness of not less than 10 Å, preferably between 10 Å and 100 Å, and more preferably between 10 Å and 50 Å. While amorphous silicon has been advantageously utilized in the present invention method, other material layers that is compatible with the subsequently deposited silicon dioxide layer and which can function as a diffusion barrier for the oxidant used in the formation of the oxide dielectric layer can also be suitably used. For instance, a thin silicon layer may also be used to cover the refractory metal silicide gate structure 60.

After the deposition of the amorphous silicon layer 72 on the underlying refractory metal silicide gate structure 60, the semiconductor device 50 is placed in an oxidation furnace wherein a chemical vapor deposition process can be carried out by using dichlorosilane and nitrous oxide as the reactants. The DCS/nitrous oxide process is more preferred than the silane/nitrous oxide process since it provides better step coverage and is not affected as much by the residual chlorine. However, the tradeoff is that the $DCS/N_2O$ process must be carried out at a higher temperature, i.e., a temperature of 800° C. which is higher than that required in the silane/$N_2O$ process. The higher reaction temperature presents a greater potential for the tungsten silicide layer to be attacked by the oxidant during the oxide formation process. The present invention novel method of depositing a thin amorphous silicon layer can therefore effectively stop the tungsten silicide layer from being oxidized and damaged by acting both as a diffusion barrier for the oxidant and as a source of supply for silicon for oxidation.

Figure 6:
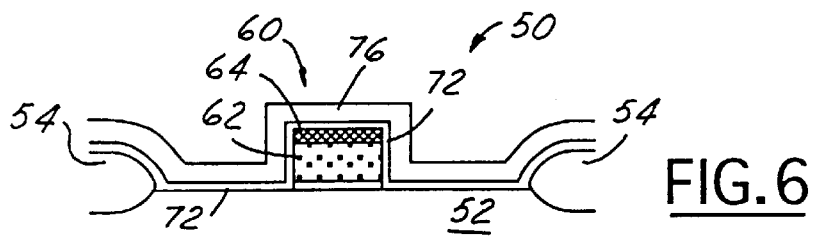
FIG. 6 is an enlarged, cross-sectional view of the present invention semiconductor structure shown in FIG. 5 having an oxide dielectric layer layer deposited on top.
Figure 7:
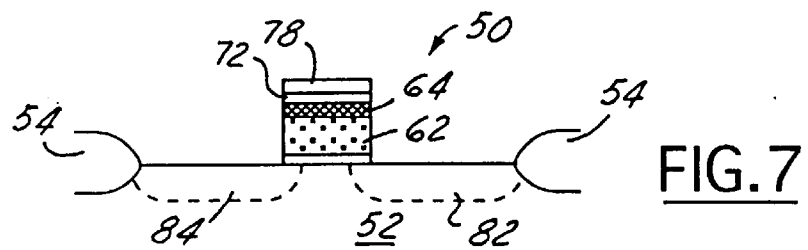
FIG. 7 is an enlarged, cross-sectional view of the present invention semiconductor structure shown in FIG. 6 after the oxide layer is etched back to form an oxide dielectric layer.

In the next fabrication step, a layer of silicon dioxide 76 is deposited by a chemical vapor deposition process on the gate structure 60 and the silicon substrate 52. This is shown in FIG. 6. The oxide layer 76 and the amorphous silicon layer 72 are then patterned and etched together in forming oxide dielectric layer 78, as shown in FIG. 7. A thin amorphous silicon layer 72 between the oxide dielectric layer and the gate structure 60 may remain after the formation. A drain region and a diffusion region 82 and 84 are subsequently formed by an ion implantation process.

The present invention novel method of using an amorphous silicon layer deposited on a refractory metal silicide gate structure for protecting the gate structure during a furnace oxidation process of forming an oxide dielectric layer on the gate structure is therefore fully demonstrated by the above descriptions. It should be noted that while an amorphous silicon material having a thickness between 10 Å and 100 Å is used in demonstrating the present invention, any other suitable material layer that can act as a diffusion barrier for the oxidant and as a sacrificial layer (as a source for oxidation) can be utilized.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of forming an oxide dielectric layer on a tungsten suicide gate structure comprising the steps of:
   providing a silicon substrate,
   forming a tungsten silicide gate structure on said substrate,
   depositing an amorphous silicon layer of at least 10 Å thick on said tungsten silicide gate structure, and
   forming an oxide layer on top of said amorphous silicon layer, whereby said amorphous silicon layer protects said tungsten silicide gate structure such that the formation of a porous, fibrous layer of a reaction product of tungsten silicide during the oxidation process can be prevented.

2. A method according to claim 1, wherein said tungsten silicide gate structure is formed by the sequential deposition of a gate oxide layer, a doped polysilicon layer and a tungsten layer, and the patterning and etching of said layers.

3. A method according to claim 1, wherein said amorphous silicon layer deposited has a thickness between about 10 Å and about 100 Å.

4. A method according to claim 1, wherein said amorphous silicon layer is deposited by a chemical vapor deposition technique.

5. A method according to claim 1, wherein said oxide layer is deposited by a reaction between dichlorosilane and nitrous oxide.

6. A method according to claim 1, wherein said oxide layer is formed at a reaction temperature between about 700° C. and about 1000° C.

7. A method of forming an oxide dielectric layer on a refractory metal silicide gate comprising the steps of:
   providing a semi-conducting substrate,
   forming a refractory metal silicide gate on said substrate,
   depositing an amorphous silicon layer having a thickness between about 10 Å and about 100 Å on top of said gate, and
   forming an oxide dielectric layer on top of said amorphous silicon and said gate.

8. A method according to claim 7, wherein said refractory metal silicide is selected from the group consisting of $WSi_2$, $TiSi_2$ and $TaSi_2$.

9. A method according to claim 7, wherein said semi-conducting substrate is a silicon substrate.

10. A method according to claim 7, wherein said refractory metal silicide is formed by first sequentially depositing a gate oxide layer, a polysilicon layer and a refractory metal layer, and then patterning said layers to form a refractory metal silicide gate.

11. A method according to claim 7, wherein said amorphous silicon layer is deposited by a chemical vapor deposition technique.

12. A method according to claim 7, wherein said oxide layer is deposited from reactants comprising dichlorosilane and nitrous oxide.

13. A method according to claim 7, wherein said oxide layer is deposited by a chemical vapor deposition technique utilizing dichlorosilane and nitrous oxide as reactants.

14. A method according to claim 7, wherein said oxide layer is deposited at a reaction temperature between about 700° C. and about 1000° C.

\* \* \* \* \*